(12) United States Patent
Kawabe et al.

(10) Patent No.: US 9,606,447 B2
(45) Date of Patent: Mar. 28, 2017

(54) REFLECTIVE MIRROR, PROJECTION OPTICAL SYSTEM, EXPOSURE APPARATUS, AND DEVICE MANUFACTURING METHOD

(71) Applicant: Nikon Corporation, Tokyo (JP)

(72) Inventors: Yoshio Kawabe, Kumagaya (JP); Hiroshi Chiba, Ageo (JP)

(73) Assignee: Nikon Corporation, Tokyo (JP)

( * ) Notice: Subject to any disclaimer, the term of this patent is extended or adjusted under 35 U.S.C. 154(b) by 75 days.

(21) Appl. No.: 14/402,666

(22) PCT Filed: Mar. 15, 2013

(86) PCT No.: PCT/JP2013/057471
§ 371 (c)(1),
(2) Date: Apr. 20, 2015

(87) PCT Pub. No.: WO2013/175835
PCT Pub. Date: Nov. 28, 2013

(65) Prior Publication Data
US 2015/0219997 A1 Aug. 6, 2015

(30) Foreign Application Priority Data

May 21, 2012 (JP) .................. 2012-115533

(51) Int. Cl.
*G03F 7/20* (2006.01)
*G02B 5/08* (2006.01)
*G21K 1/06* (2006.01)

(52) U.S. Cl.
CPC ....... *G03F 7/70316* (2013.01); *G02B 5/0816* (2013.01); *G02B 5/0833* (2013.01);
(Continued)

(58) Field of Classification Search
CPC . G02B 5/0816; G02B 5/0891; G03F 7/70958; G03F 7/702; G03F 7/70316; G21K 1/062; G21K 2201/061
See application file for complete search history.

(56) References Cited

U.S. PATENT DOCUMENTS 6,208,407 B1 3/2001 Loopstra
6,262,796 B1 7/2001 Loopstra et al.
(Continued)

FOREIGN PATENT DOCUMENTS

JP 2004-356415 12/2004
JP 2011-228699 11/2011

OTHER PUBLICATIONS

International Search Report and Written Opinion from International Application No. PCT/JP2013/057471, dated Jun. 11, 2013, 13 pages (with English translations).

*Primary Examiner* — Michelle M Iacoletti
(74) *Attorney, Agent, or Firm* — Klarquist Sparkman, LLP

(57) ABSTRACT

A reflective mirror is provided with a base and a multilayer film including first layers and second layers laminated alternately on the base and capable of reflecting at least a portion of the incident light. The multilayer film is provided with a first portion having a first thickness, and with a second portion which has a second thickness different from the first thickness and which is provided at a position rotationally symmetric to that of the first portion about the optical axis of the reflective mirror relative.

30 Claims, 11 Drawing Sheets

(52) U.S. Cl.
CPC ............ *G02B 5/0891* (2013.01); *G03F 7/20* (2013.01); *G03F 7/702* (2013.01); *G21K 1/062* (2013.01); *G21K 2201/061* (2013.01)

(56) References Cited

U.S. PATENT DOCUMENTS

| | | |
|---|---|---|
| 6,341,007 B1 | 1/2002 | Nishi et al. |
| 6,400,441 B1 | 6/2002 | Nishi et al. |
| 6,452,661 B1 | 9/2002 | Komatsuda |
| 6,549,269 B1 | 4/2003 | Nishi et al. |
| 6,590,634 B1 | 7/2003 | Nishi et al. |
| 6,611,316 B2 | 8/2003 | Sewell |
| 6,897,963 B1 | 5/2005 | Taniguchi et al. |
| 2005/0157384 A1 | 7/2005 | Shiraishi et al. |
| 2005/0237618 A1* | 10/2005 | Yamamoto ......... G02B 26/0825 359/587 |
| 2011/0228245 A1 | 9/2011 | Mann |

* cited by examiner

REFLECTIVE MIRROR, PROJECTION OPTICAL SYSTEM, EXPOSURE APPARATUS, AND DEVICE MANUFACTURING METHOD

TECHNICAL FIELD

The present invention relates to a reflective mirror, a projection optical system, an exposure apparatus, and a device manufacturing method.

CROSS REFERENCE TO RELATED APPLICATIONS

The present application is the U.S. National Stage of International Application No. PCT/JP2013/057471, filed Mar. 15, 2013, which claims priority based on Japanese Patent Application No. 2012-115533 filed on May 21, 2012, the contents of which are incorporated herein by reference.

BACKGROUND

Relating to exposure apparatuses for use in a photolithography process, EUV exposure apparatuses in which extreme ultraviolet (EUV) light is used as exposure light have been proposed, as disclosed, for example, in the following Patent Document 1. In an optical system of an EUV exposure apparatus, a multilayer-film reflective mirror having a multilayer film capable of reflecting at least a portion of incident light is used.

RELATED ART DOCUMENT

Patent Document

[Patent Document 1] U.S. Patent Application Publication No. 2005/157384

SUMMARY

Problems to be Solved by the Invention

In multilayer-film reflective mirrors, there is a possibility that the reflectance of the multilayer film will change according to the incident angle of the light with respect to the multilayer film. For example, when the reflectance of the multilayer film decreases, there is a possibility that exposure light of a desired intensity will not be irradiated onto a substrate. Consequently, there is a possibility that exposure defects will be generated and defective devices will be manufactured.

An object of aspects of the present invention is to provide a reflective mirror with high reflectance. Another object of the aspects of the present invention is to provide a projection optical system and an exposure apparatus which can suppress the generation of exposure defects. Accordingly, the throughput of the exposure apparatus is improved. Still another object of the aspects of the present invention is to provide a device manufacturing method which can suppress the generation of defective devices. Accordingly, the throughput of the device manufacturing is improved.

Means for Solving the Problem

According to a first aspect of the present invention, there is provided a reflective mirror reflecting incident light, the reflective mirror including: a base, and a multilayer film configured to reflect at least a portion of the incident light and having a first layer and second layer that are laminated alternately on the base, the multilayer film being provided with a first portion having a first thickness and with a second portion having a second thickness different from the first thickness, the second portion being provided at a position rotationally symmetric to a position of the first portion about an optical axis of the reflective mirror.

According to a second aspect of the present invention, there is provided a projection optical system including a plurality of optical elements, the projection optical system projecting an image of a first surface onto a second surface, and at least one of the optical elements being the reflective mirror according to the first aspect.

According to a third aspect of the present invention, there is provided an exposure apparatus for exposing a substrate to exposure light, the exposure apparatus including the reflective mirror according to the first aspect.

According to a fourth aspect of the present invention, there is provided a device manufacturing method including exposing a substrate using the exposure apparatus according to the third aspect, and developing the exposed substrate.

Advantage of the Invention

According to the aspects of the present invention, it is possible to suppress a decrease in reflectance in the multilayer film. In addition, according to the aspects of the present invention, it is possible to suppress the generation of exposure defects and the generation of defective devices. Accordingly, it is possible to use a reflective mirror with high reflectance. In addition, the throughput of the exposure apparatus is improved.

DESCRIPTION OF THE EMBODIMENTS

Below, description will be given of embodiments of the present invention with reference to the diagrams; however, the present invention is not limited to the description. In the following description, an XYZ rectangular coordinate system is established, and the positional relationship of respective members is described with reference to the XYZ rectangular coordinate system. A predetermined direction within a horizontal plane is made the X axis direction, a direction orthogonal to the X axis direction within the horizontal plane is made the Y axis direction, and a direction orthogonal to both the X axis direction and the Y axis direction (that is, a perpendicular direction) is made the Z axis direction. Rotation (tilt) directions about the X axis, the Y axis, and the Z axis are made the θX, θY and θZ directions, respectively.

Figure 1:
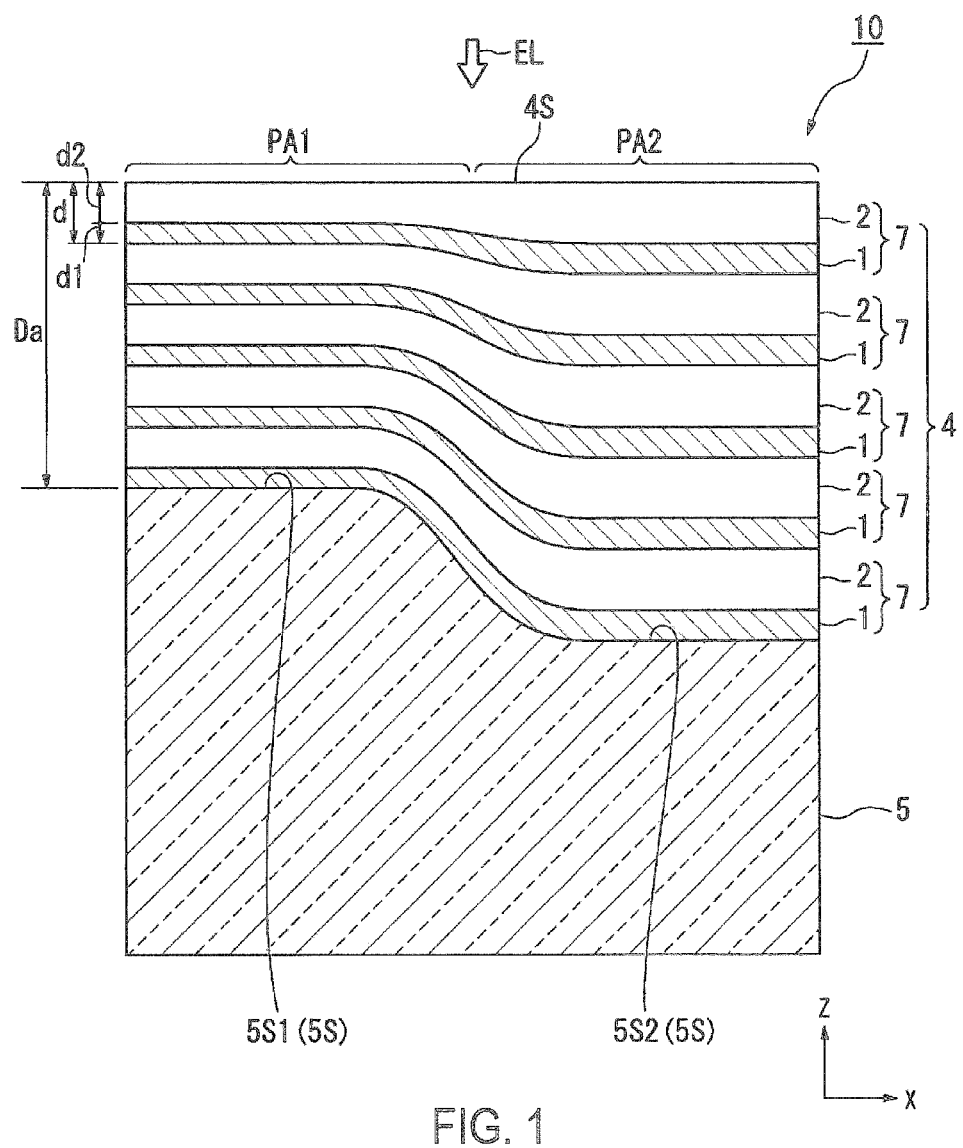
FIG. 1 is a diagram showing an example of a multilayer-film reflective mirror according to a present embodiment.

FIG. 1 is a schematic view showing an example of a multilayer-film reflective mirror 10 (reflective mirror) according to the present embodiment. In FIG. 1, the multilayer-film reflective mirror 10 is provided with a base 5, and a multilayer film 4 having a first layer 1 and second layer 2 laminated alternately on the base 5 and capable of reflecting at least a portion of incident light EL.

In the present embodiment, the light EL incident on the multilayer film 4 contains extreme ultraviolet light. Extreme ultraviolet light is, for example, an electromagnetic wave in a soft X-ray region with a wavelength of approximately 11 to 14 nm. Extreme ultraviolet light is reflected by the multilayer film 4. In the following description, extreme ultraviolet light will be referred to as EUV light as appropriate.

Here, the light EL incident on the multilayer film 4 may be an electromagnetic wave in a soft X-ray region of approximately 5 to 50 nm or may be an electromagnetic wave of approximately 5 to 20 nm. In addition, the light EL may be an electromagnetic wave with a wavelength of 193 nm or less. For example, the light EL may be vacuum ultraviolet (VUV) light such as ArF excimer laser light (wavelength of 193 nm) or $F_2$ laser light (wavelength of 157 nm).

The base 5 is, for example, formed of ultra-low expansion glass. As the base 5, ULE manufactured by Corning Inc., Zerodur (registered trademark) manufactured by Schott AG, or the like is used.

The multilayer film 4 includes the first layer 1 and second layer 2 laminated alternately with a predetermined periodic length d. The periodic length d refers to the sum $(d_1+d_2)$ of the thickness $d_1$ of the first layer 1 and the thickness $d_2$ of the second layer 2. Based on the theory of optical interference, each of the thickness $d_1$ of the first layer 1 and the thickness $d_2$ of the second layer 2 is set such that the reflected waves reflected by each interface with the first layer 1 and the second layer 2 coincide with one another in phase.

In the following description, one set of the first layer 1 and the second layer 2 is referred to as a layer pair 7 as appropriate. In the present embodiment, with regard to one layer pair 7, the first layer 1 is arranged on the base 5 side (on the −Z side in the diagram) with respect to the second layer 2. The multilayer film 4 is formed by the layer pair 7 of the first layer 1 and the second layer 2 being laminated on the base 5.

For example, there are tens to hundreds of the layer pairs 7 laminated on the base 5. As an example, in the present embodiment, there are 50 layer pairs 7 laminated on the base 5.

In the present embodiment, the thickness of the multilayer film 4 includes a thickness Da of the entirety of the multilayer film 4 which is the sum of the thicknesses of the plurality (for example, 50) of the layer pairs 7. In addition, in the present embodiment, the thickness of the multilayer film 4 includes the thickness of one layer pair 7 including one first layer 1 and one second layer 2. That is, in the present embodiment, the thickness of the multilayer film 4 includes the periodic length d $(=d_1+d_2)$.

The first layer 1 is formed of a material with a refractive index differing greatly from the refractive index of vacuum with respect to EUV light. The second layer 2 is formed of a material with a refractive index differing little from the refractive index of vacuum with respect to EUV light. In the present embodiment, the first layer (heavy atom layer) 1 is formed of molybdenum (Mo). The second layer (light atom layer) 2 is formed of silicon (Si). That is, the multilayer film 4 of the present embodiment is a Mo/Si multilayer film where a molybdenum layer (Mo layer) and a silicon layer (Si layer) are laminated alternately.

The refractive index of vacuum n is 1. In addition, for example, the refractive index of molybdenum $n_{Mo}$ with respect to EUV light with a wavelength of 13.5 nm is 0.92, and the refractive index of silicon $n_{Si}$ is 0.998. In this manner, the second layer 2 is formed of a material where the refractive index with respect to EUV light is substantially equal to the refractive index of vacuum.

As shown in FIG. 1, in the present embodiment, there is a distribution in the thickness of the multilayer film 4. In other words, the multilayer film 4 has a plurality of portions with different thicknesses. As shown in FIG. 1, the multilayer film 4 has at least a first portion PA1 with a first thickness and a second portion PA2 with a second thickness which is different from the first thickness.

In the present embodiment, the distribution of the thickness of the multilayer film 4 (the thickness distribution of the multilayer film) does not have an axis of rotational symmetry. The multilayer film 4 has a thickness distribution which is not rotationally symmetric (a non-rotationally symmetric thickness distribution). In the present embodiment, the distribution of the thickness of the multilayer film 4 is non-rotationally symmetric with respect to the center of the region to which the light EL is incident on a surface 4S of the multilayer film 4. In the present embodiment, the distribution of the thickness of the multilayer film 4 is non-rotationally symmetric with respect to any position on the XY plane on the surface 4S of the multilayer film 4.

In addition, in the present embodiment, the shape of a surface 5S of the base 5 where the multilayer film 4 is formed is determined such that an aberration caused by the distribution of the thickness of the multilayer film 4 are reduced. In the example shown in FIG. 1, the shape of the surface 5S of the base 5 is determined such that a surface 5S2 of the base 5 where the second portion PA2 is formed is arranged at a position further from the surface 4S of the multilayer film 4 than that of a surface 5S1 of the base 5 where the first portion PA1 is formed.

Figure 2:
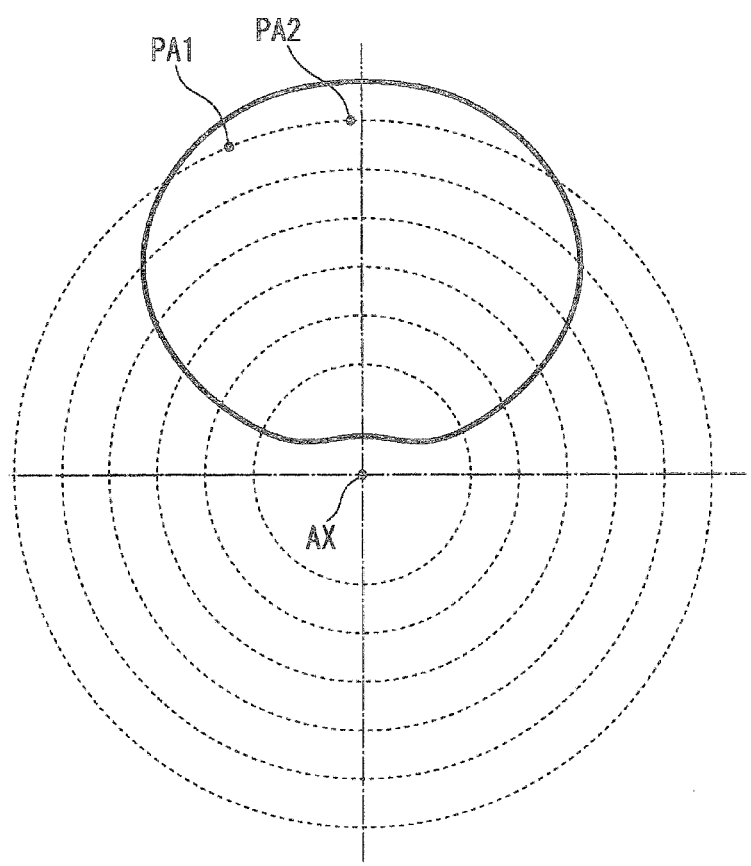
FIG. 2 is a diagram for explaining the multilayer-film reflective mirror according to the present embodiment.

FIG. 2 is a diagram schematically showing the surface 4S of the multilayer film 4. In FIG. 2, the thickness of the multilayer film 4 is different in the first position (the first portion PA1) and the second position (the second portion PA2) of the surface 4S. In the example shown in FIG. 2, the first portion PA1 and the second portion PA2 are at an equal distance from an optical axis AX of the multilayer-film reflective mirror 10. That is, the distance between the first portion PA1 and the optical axis AX is equal to the distance between the second portion PA2 and the optical axis AX. In other words, the first portion PA1 and the second portion PA2 are positioned on a circle centered on the optical axis AX. This shows that the second portion PA2 is provided at a position which is rotationally symmetric about the optical axis (reference axis) AX of the multilayer-film reflective mirror 10 with respect to the first portion PA1.

In this manner, in the present embodiment, the distribution of the thickness of the multilayer film 4 does not have an axis of rotational symmetry (a point of rotational symmetry). In other words, the distribution of the thickness of the multilayer film 4 is not a rotationally symmetric distribution. This shows that, in the first portion PA1 and the second portion PA2 which are rotationally symmetric about the optical axis (reference axis) AX, the thicknesses of the multilayer film 4 are different from each other. That is, the multilayer-film reflective mirror 10 has a thickness distribution where the thickness of the multilayer film 4 changes in the azimuthal direction of the optical axis AX (for example, the rotation direction around the optical axis AX, the θZ direction, or the like). For example, the multilayer-film reflective mirror 10 has a thickness distribution which continuously changes along the azimuthal direction of the optical axis AX.

In addition, in the present embodiment, the distribution of the thickness of the multilayer film 4 is line symmetric with respect to a line which passes through the center of the region to which the light EL is incident on the surface 4S of the multilayer film 4. In addition, in the present embodiment, the distribution of the thickness of the multilayer film 4 is line symmetric with respect to a line which passes through the optical axis AX and the center of the region to which the light EL is incident on the surface 4S of the multilayer film 4. In addition, in the present embodiment, the distribution of the thickness of the multilayer film 4 has a finite number of axes of rotational symmetry in the surface 4S of the multilayer film 4. The multilayer film 4 has a thickness distribution which has a finite number of rotational symmetry in the surface 4S of the multilayer film 4. Note that, in either case, the multilayer-film reflective mirror 10 is provided with the first portion PA1 which has the first thickness and the second portion PA2 which has a second thickness different from the first thickness, second portion PA2 being provided at a position rotationally symmetric about the optical axis AX of the multilayer-film reflective mirror 10 with respect to a position of the first portion PA1. For example, even in a case where the distribution of the thickness of the multilayer film 4 has a finite number of rotational symmetry in the surface 4S of the multilayer film 4, at least a part of the multilayer-film reflective mirror 10 has portions where the thicknesses of the multilayer film are different from each other at positions rotationally symmetric about the optical axis AX.

Figure 3:
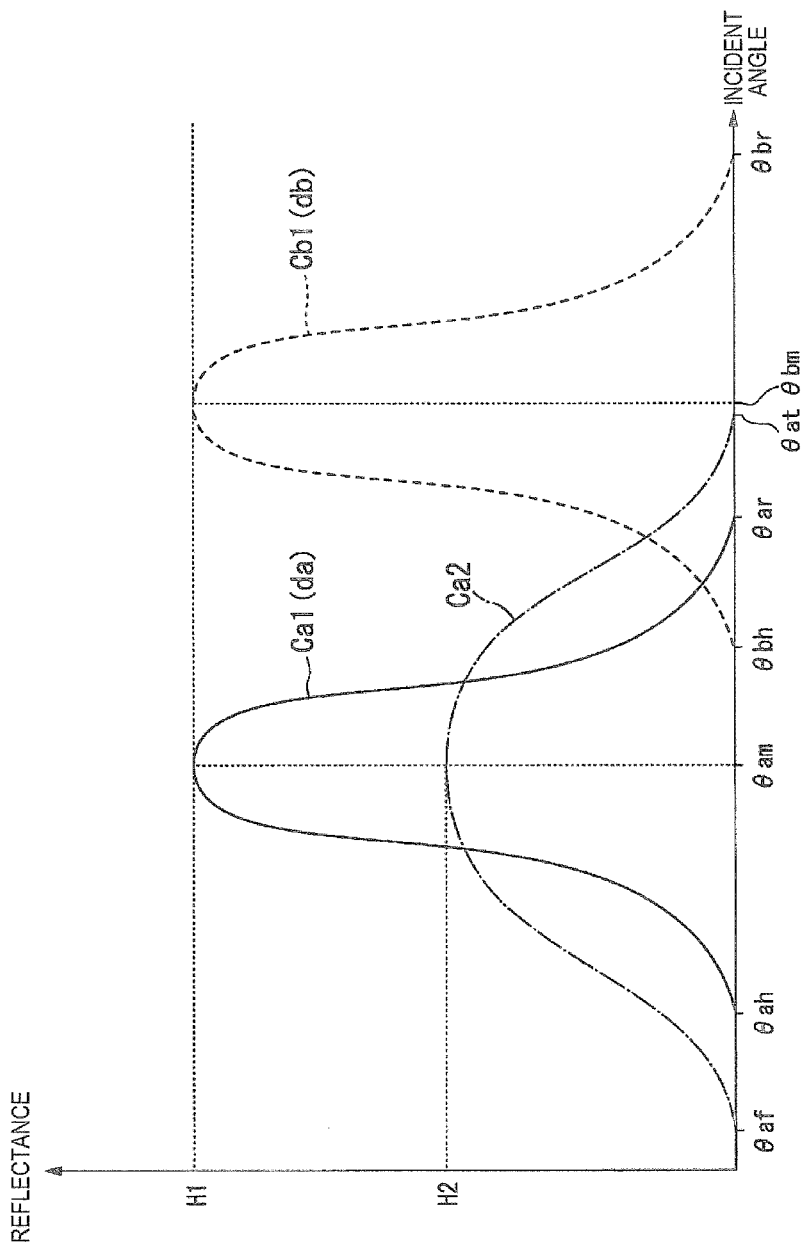
FIG. 3 is a diagram showing an example of a relationship between an incident angle of light and reflectance with respect to a surface of a multilayer film.

FIG. 3 is a diagram showing a relationship between the incident angle of the light EL with respect to the surface 4S of the multilayer film 4 and the reflectance of the multilayer film 4 with respect to the incident light EL. When the thickness of the multilayer film 4 changes, the reflectance characteristic with respect to the incident angle changes.

For example, as shown by lines Ca1 and Cb1 in FIG. 3, the multilayer film 4 with the periodic length da is capable of reflecting the light EL incident at an incident angle of from θah to θar. The multilayer film 4 with a periodic length db is capable of reflecting the light EL incident at an incident angle of from θbh to θbr.

In addition, the multilayer film 4 with the periodic length da reflects the light EL, which is incident at the incident angle θam, with a reflectance H1. The multilayer film 4 with the periodic length db reflects the light EL, which is incident at the incident angle θbm, with the reflectance H1. The incident angle θam is a value in the middle of the incident angles of from θah to θar. The incident angle θbm is a value in the middle of the incident angles of from θbh to θbr. The reflectance H1 is the maximum reflectance (peak reflectance) when the light EL is incident at an incident angle of from θah to θar on the surface 4S of the multilayer film 4 with the periodic length da. The reflectance H1 is the maximum reflectance (peak reflectance) when the light EL is incident at an incident angle of from θbh to θbr on the surface 4S of the multilayer film 4 with the periodic length db.

Note that, in FIG. 3, the lines Ca1 and Cb1 have bilateral symmetry; however, there is a possibility that the lines will not have bilateral symmetry. In addition, FIG. 3 shows an example where the value in the middle of the incident angles is the maximum reflectance; however, there is a possibility that the value in the middle of the incident angles will not be the maximum reflectance.

In this manner, the incident angle where the reflectance H1 is obtained is θam when the light EL is incident on the surface 4S of the multilayer film 4 with the periodic length da, and the incident angle where the reflectance H1 is obtained is θbm when the light EL is incident on the surface 4S of the multilayer film 4 with the periodic length db. In other words, it is possible to obtain the reflectance H1 by setting the periodic length of the multilayer film 4 where the light EL is incident at the incident angle θam to da, and it is possible to obtain the reflectance H1 by setting the periodic length of the multilayer film 4 where the light EL is incident at the incident angle θbm to db.

In addition, as shown in FIG. 3, the reflectance is substantially zero even when the light EL is incident on the surface 4S of the multilayer film 4 with the periodic length da at the incident angle θbm. In other words, the light EL is substantially not reflected even when the light EL is incident on the surface 4S of the multilayer film 4 with the periodic length da at the incident angle θbm.

In addition, the reflectance is substantially zero even when the light EL is incident on the surface 4S of the multilayer film 4 with the periodic length db at the incident angle θam. In other words, the light EL is substantially not reflected even when the light EL is incident on the surface 4S of the multilayer film 4 with the periodic length db at the incident angle θam.

In addition, as shown by line Ca2 in FIG. 3, it is possible to adjust the incident angle (incident angle range) of the light EL which the multilayer film 4 is capable of reflecting by adjusting at least one of the thickness $d_1$ of the first layer 1 and the thickness $d_2$ of the second layer 2.

For example, it is possible to increase the incident angle range of the light EL which the multilayer film 4 is capable of reflecting by adjusting at least one of the thickness $d_1$ of the first layer 1 and the thickness $d_2$ of the second layer 2. In addition, it is possible to decrease the incident angle range of the light EL which the multilayer film 4 is capable of reflecting by adjusting at least one of the thickness $d_1$ of the first layer 1 and the thickness $d_2$ of the second layer 2. In the example shown by line Ca2, it is possible for the multilayer film 4 to reflect the light EL which is incident at the incident angles of from θaf to θat.

In addition, the maximum reflectance is adjusted by adjusting at least one of the thickness $d_1$ of the first layer 1 and the thickness $d_2$ of the second layer 2. In the example shown in FIG. 3, the reflectance (maximum reflectance) H2 is smaller than the reflectance (maximum reflectance) H1.

In addition, it is even possible to adjust the incident angle (incident angle range) which the multilayer film 4 is capable of reflecting by adjusting the thickness Da of the entire multilayer film 4. In addition, it is even possible to adjust the maximum reflectance of the multilayer film 4 by adjusting the thickness a of the entire multilayer film 4.

In this manner, at least one of the incident angle (incident angle range) of the light EL which can be reflected, and the reflectance (maximum reflectance) with respect to the incident angle of the light EL is determined based on the thickness of the multilayer film 4, which includes at least one of the periodic length d of the multilayer film 4, the thickness $d_1$ of the first layer 1, the thickness $d_2$ of the second layer 2, and the thickness Da of the entire multilayer film 4. In addition, it is possible to adjust at least one of the incident angle range and the maximum reflectance by adjusting the thickness of the multilayer film 4.

Figure 4:
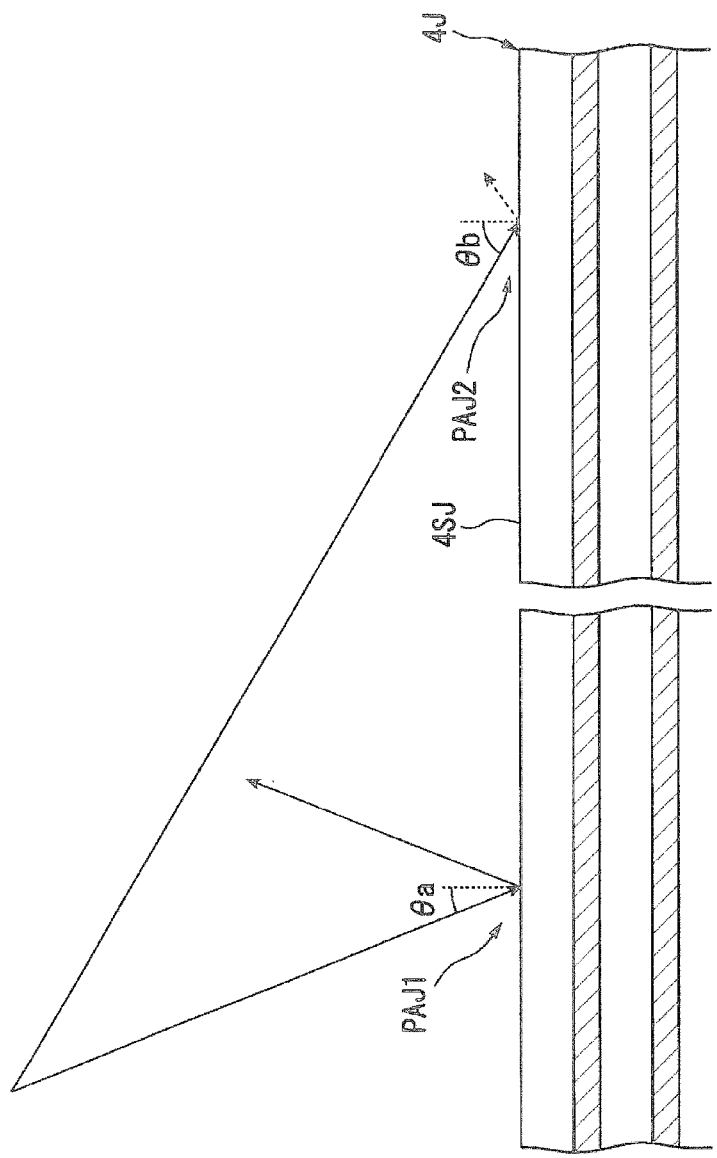
FIG. 4 is a schematic view for explaining a multilayer film according to a Comparative Example.

FIG. 4 is a schematic view showing a multilayer film 4J according to a Comparative Example. In FIG. 4, the light EL is incident at a first incident angle θa to a position (portion PAJ1) on a surface 4SJ of the multilayer film 4J, and the light EL is incident at a second incident angle θb to a position (portion PAJ2) which is different from the portion PAJ1. In the multilayer film 4J, the thickness of the portion PAJ1 and the thickness of the portion PAJ2 are equal to each other. The light EL incident on the portion PAJ1 is reflected. On the other hand, the light EL incident on the portio PAJ2 is not reflected.

Figure 5:
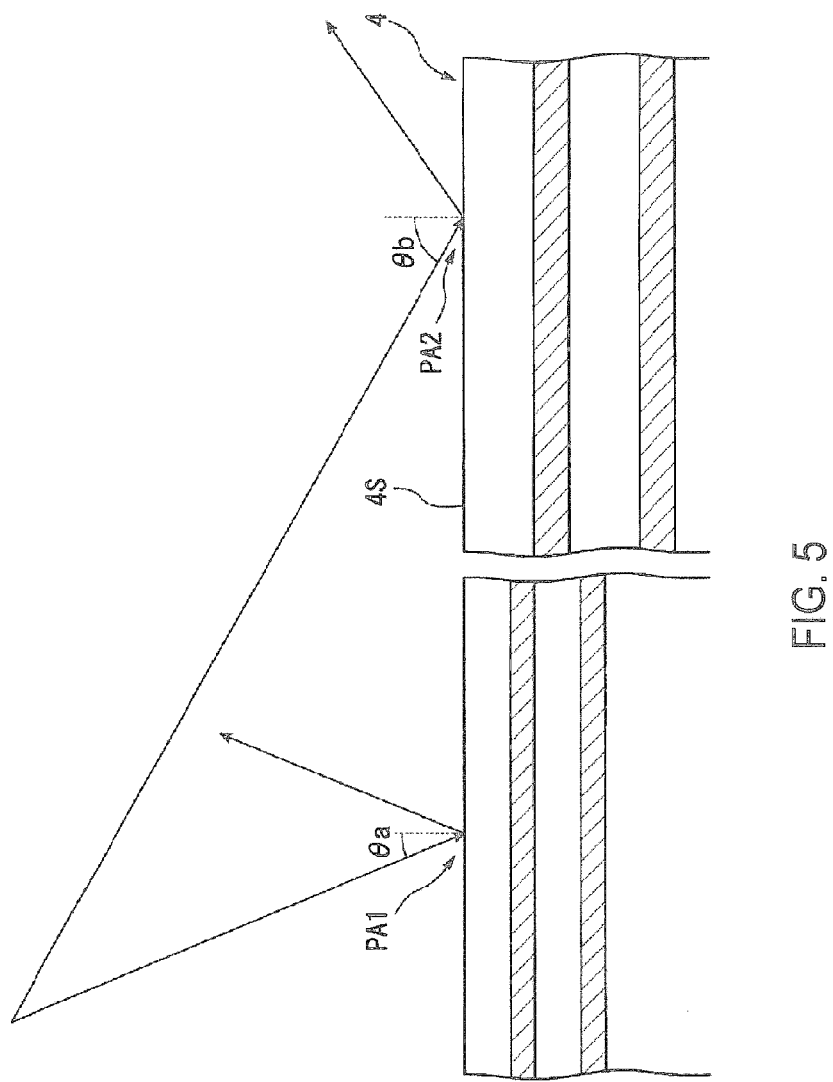
FIG. 5 is a schematic view for explaining a multilayer film according to the present embodiment.

FIG. 5 is a schematic view showing the multilayer film 4 according to the present embodiment. The light EL is incident at the first incident angle θa to a first position (first portion PA1) on the surface 4S of the multilayer film 4, and the light EL is incident at the second incident angle θb to a second position (second portion PA2) which is different from the first portion PA1.

In the multilayer film 4, the thickness of the first portion PA1 and the thickness of the second portion PA2 of the multilayer film 4 are different from each other. The first portion PA1 has a thickness capable of reflecting the light EL which is incident at the first incident angle θa. The second portion PA2 has a thickness capable of reflecting the light EL which is incident at the second incident angle θb.

In the present embodiment, the thicknesses of the multilayer film 4 in the first portion PA1 and the second portion PA2 are determined such that the reflectances of the light EL in the first portion PA1 (first position) and the second portion PA2 (second position) are high, and the difference between the reflectances is reduced.

Figure 6:
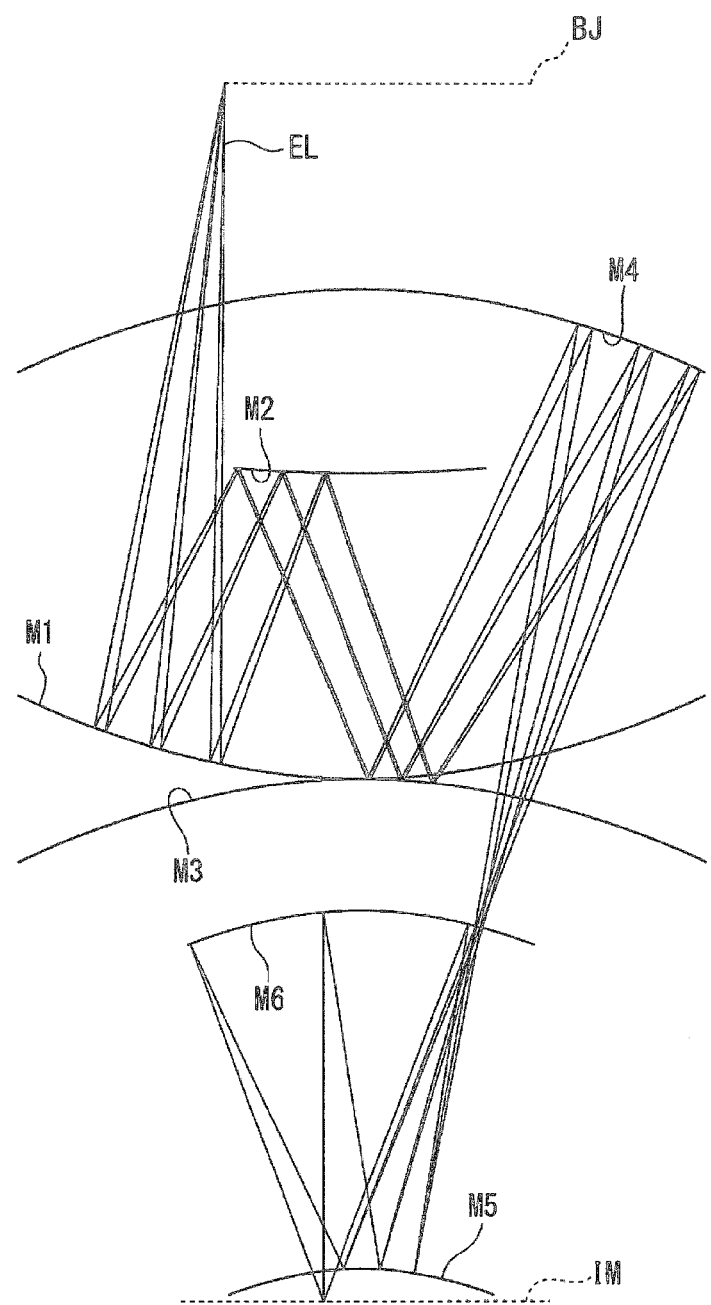
FIG. 6 is a diagram showing an example of an optical system according to the present embodiment.

FIG. 6 is a diagram showing an example of a projection optical system PL according to the present embodiment. The projection optical system PL has a plurality of optical elements and projects an image of a first surface BJ onto a second surface IM. The light EL from the first surface BJ is irradiated onto the second surface IM via the plurality of optical elements of the projection optical system PL. In the present embodiment, at least one of the plurality of optical elements of the projection optical system PL is the multilayer-film reflective mirror 10 having the multilayer film 4.

For example, an optical element having the largest incident angle range of the light EL out of the plurality of optical elements of the projection optical system PL may be the multilayer-film reflective mirror 10 according to the present embodiment. In the example shown in FIG. 6, after being reflected by an optical element M1, the light EL from the first surface BJ is irradiated onto the second surface IM via an optical element M2, an optical element M3, an optical element M4, an optical element M5, and an optical element M6.

In such a case, for example, the optical element M3 may be the multilayer-film reflective mirror 10, or the optical element M5 may be the multilayer-film reflective mirror 10. Naturally, at least one of the optical elements M1, M2, M4, M6 may be the multilayer-film reflective mirror 10, or all of the optical elements M1 to M6 may be the multilayer-film reflective mirror 10.

Figure 7:
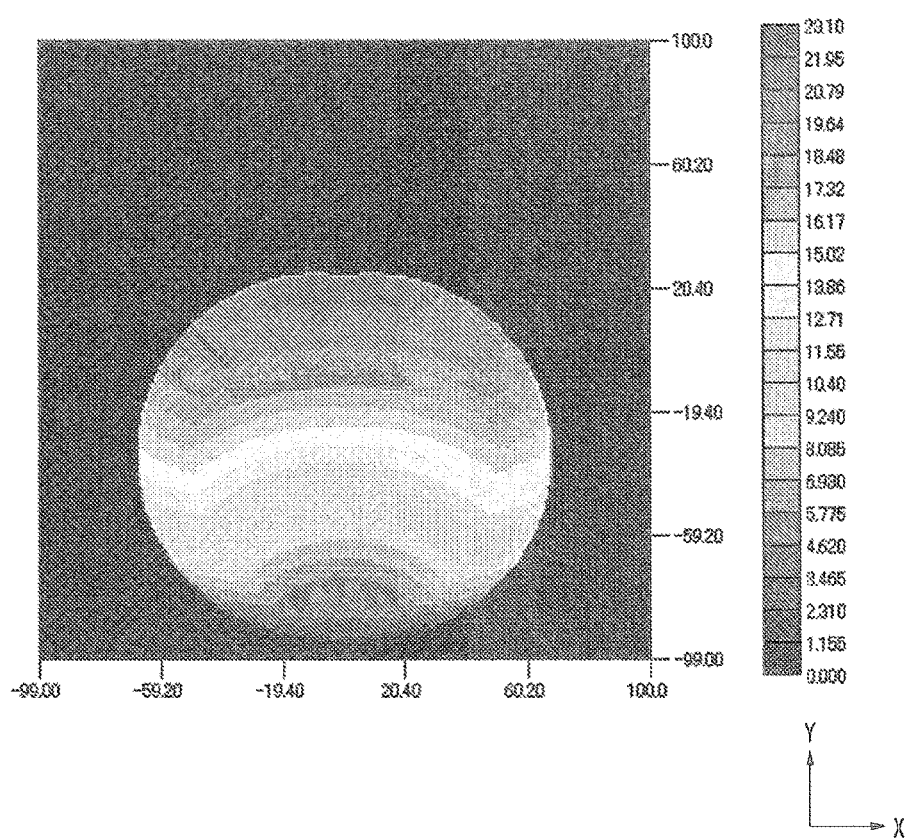
FIG. 7 is a diagram for explaining an example of the multilayer-film reflective mirror according to the present embodiment.
Figure 8:
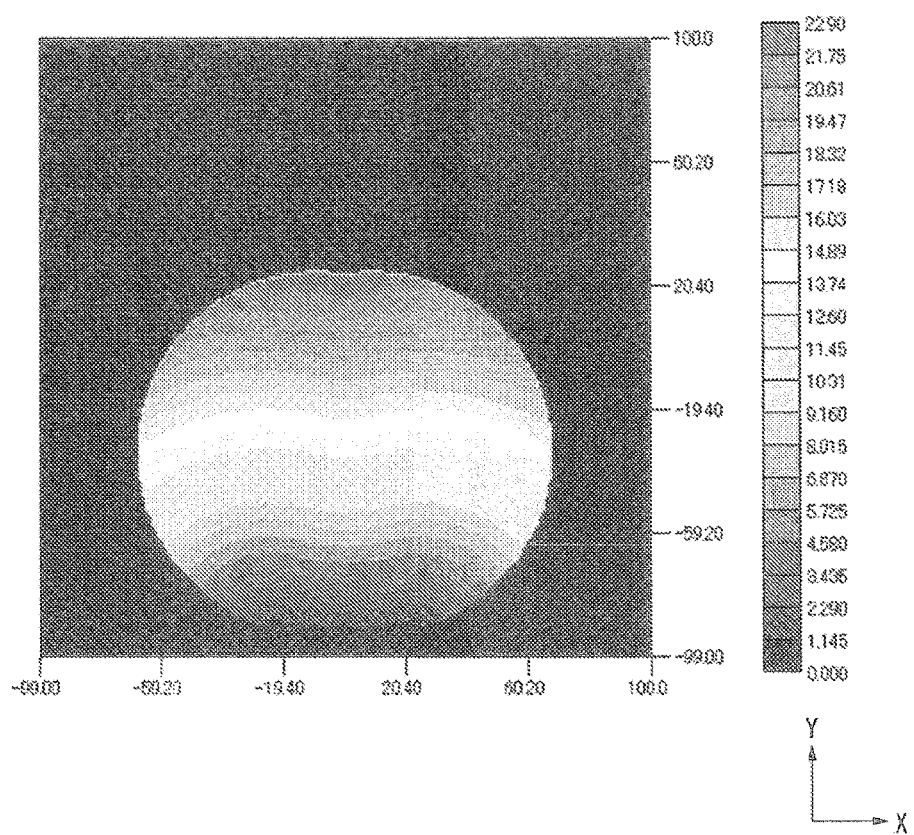
FIG. 8 is a diagram for explaining an example of the multilayer-film reflective mirror according to the present embodiment.

FIG. 7 and FIG. 8 are diagrams showing examples of distributions of the incident angle of the light EL with respect to the multilayer film 4. As shown in FIG. 7 and FIG. 8, in the present embodiment, the distribution of the incident angle of the light EL with respect to the multilayer film 4 is line symmetric with respect to a line parallel with the Y axis in the diagram. The direction parallel with the Y axis is a scanning direction (scan direction) when a substrate P is exposed in an exposure apparatus EX to be described below.

For example, in FIG. 7, the multilayer film 4 has a portion where the incident angle of the light EL is 23.10°. In addition, the multilayer film 4 has a portion where the incident angle of the light EL is 1.155°.

Figure 9:
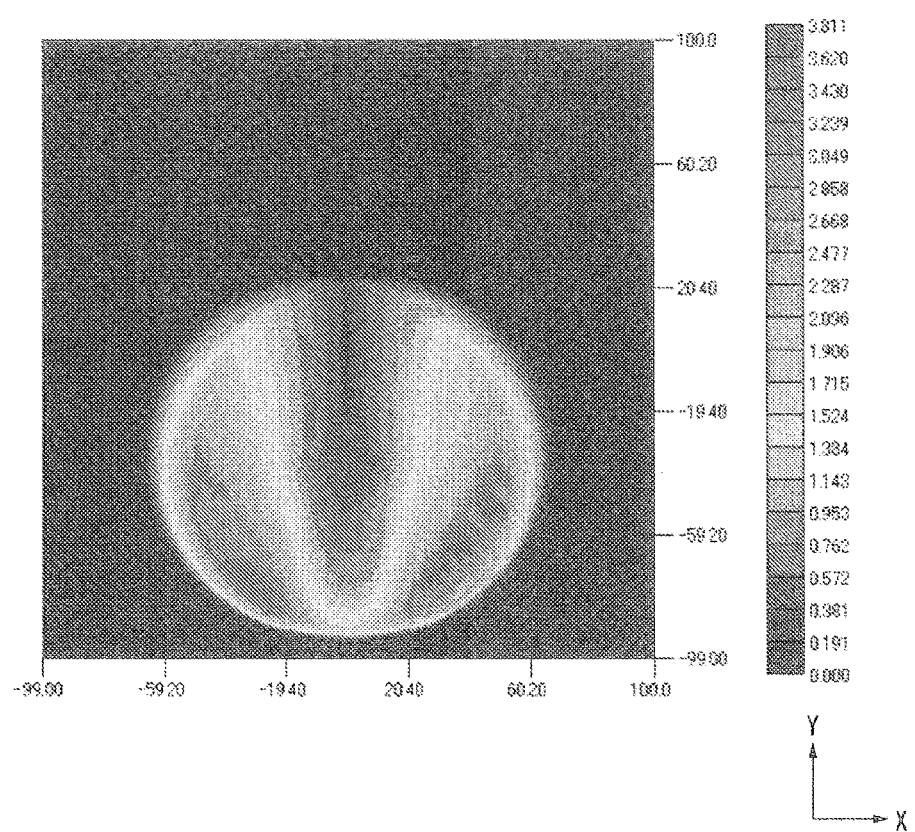
FIG. 9 is a diagram for explaining an example of the multilayer-film reflective mirror according to the present embodiment.

FIG. 9 is an example showing a difference in the incident angle distribution of the maximum incident angle of the light EL incident on the multilayer film 4 (for example, FIG. 7) and the incident angle distribution of the minimum incident angle (for example, FIG. 8). The incident angle of the light EL incident on the multilayer film 4 changes in a case where the numerical aperture NA of the projection optical system PL changes, a case where the image height changes, or the like. In the present embodiment, for example, the multilayer film 4 is formed in consideration of the incident angle distribution of the maximum incident angle and the incident angle distribution of the minimum incident angle. In one example, it is possible for the multilayer film 4 to have the thickness distribution shown in FIG. 9. In such a case, in the multilayer-film reflective mirror 10, the thickness of the multilayer film 4 changes according to the gradations shown FIG. 9. For example, the multilayer film 4 has a high film thickness at points in FIG. 9 showing high values, and has a low film thickness at points showing low values.

In addition, in the present embodiment, the distribution of the thickness of the multilayer film 4 is line symmetric with respect to a line parallel with the Y axis. The direction parallel with the Y axis is a scanning direction (scan direction) when the substrate P is exposed in the exposure apparatus EX to be described below.

The distribution of the thickness of the multilayer film 4 may be represented by the rectangular coordinate system. In addition, the distribution of the thickness of the multilayer film 4 may be represented by the polar coordinate system. For example, the distribution of the thickness of the multilayer film 4 may be represented by a polynomial series representing the distribution of the thickness of the multilayer film 4 using the distance from the optical axis AX on the surface 4S of the multilayer film 4 and polar coordinates. In addition, the distribution of the thickness of the multilayer film 4 may be represented by Zernike polynomials.

Figure 10:
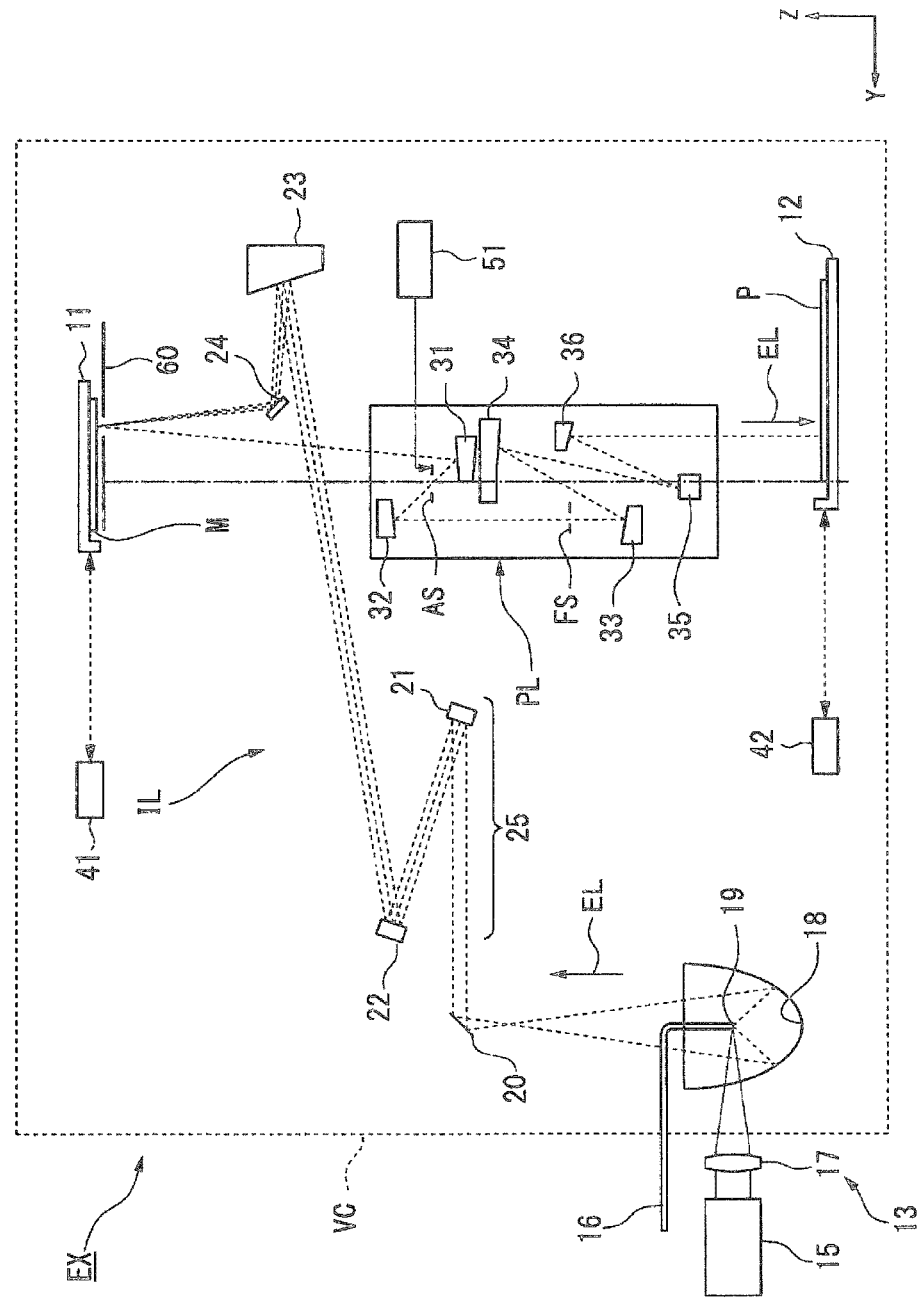
FIG. 10 is a diagram showing an example of an exposure apparatus according to the present embodiment.

FIG. 10 is a diagram showing an example of the exposure apparatus EX according to the present embodiment. The exposure apparatus EX of the present embodiment is an EUV exposure apparatus which exposes the substrate P to EUV light. The multilayer-film reflective mirror 10 described above is used as an optical system of the EUV exposure apparatus EX according to the present embodiment.

In FIG. 10, the exposure apparatus EX is provided with a mask stage 11 capable of moving while holding a mask M, a substrate stage 12 capable of moving while holding the substrate P onto which exposure light EL is irradiated, a light source apparatus 13 which generates the light (exposure light) EL which includes EUV light, an illumination optical system IL which illuminates the mask M held by the mask stage 11 with the exposure light EL emitted from the light source apparatus 13, the projection optical system PL which projects an image of a pattern of the mask M illuminated by the exposure light EL onto the substrate P, and a chamber apparatus VC which has a vacuum system which forms a predetermined space through which at least the exposure light EL passes and sets the predetermined space to a vacuum state (for example, $1.3 \times 10^{-3}$ Pa or less).

The substrate P includes a substrate where a photosensitive film is formed on a base such as a semiconductor wafer. The mask M includes a reticle where a device pattern which is projected onto the substrate P is formed. In the present embodiment, EUV light is used as the exposure light EL, and the mask M is a reflective mask which has a multilayer film capable of reflecting EUV light. The multilayer film of the reflective mask includes, for example, a Mo/Si multilayer film, and a Mo/Be multilayer film.

The exposure apparatus EX illuminates the reflecting surface (pattern forming surface) of the mask M where the multilayer film is formed with the exposure light EL and exposes the substrate P to reflected light of the exposure light EL reflected by the mask M.

The light source apparatus 13 of the present embodiment is a laser-excited plasma light source apparatus which includes a laser apparatus 15 for emitting laser light, and a supply member 16 for supplying a target material such as a xenon gas. The laser apparatus 15 generates laser light with a wavelength in the infrared region and the visible region. The laser apparatus 15 includes, for example, a YAG laser, an excimer laser, or the like using semiconductor laser excitation.

In addition, the light source apparatus 13 is provided with a first collection optical system 17 for collecting laser light emitted from the laser apparatus 15. The first collection optical system 17 collects the laser light emitted from the laser apparatus 15 at a position 19. The supply member 16 has a supply port which supplies the target material to the position 19. The laser light collected by the first collection optical system 17 is irradiated onto the target material supplied from the supply member 16.

The target material irradiated by the laser light is heated to a high temperature due to the energy of the laser light. Then, the target material is excited into a plasma state and generates light including EUV light during a transition to a low potential state. Note that, the light source apparatus 13 may be a plasma discharge light source apparatus.

The light source apparatus 13 generates light (EUV light) which has a spectrum in the extreme ultraviolet region. The exposure apparatus EX is provided with a second light-collection mirror 18 arranged at the periphery of the position 19. The second light-collection mirror 18 includes an elliptical mirror. The second light-collection mirror 18 which includes the elliptical mirror is arranged such that a first focal point and the position 19 are substantially matched.

The EUV light (exposure light) EL collected at a second focal point by the second light-collection mirror 18 is supplied to the illumination optical system IL. The illumination optical system IL includes a plurality of optical elements 20, 21, 22, 23, 24 to which the exposure light EL emitted from the light source apparatus 13 is supplied and illuminates the mask M with the exposure light EL emitted from the light source apparatus 13. At least one of the optical elements 20, 21, 22, 23, 24 of the illumination optical system IL may be the multilayer-film reflective mirror 10 described above.

The optical element 20 of the illumination optical system IL is a third light-collection mirror functioning as a collimator mirror, to which the exposure light EL from the second light-collection mirror 18 is supplied. The exposure light EL from the second light-collection mirror 18 is guided to the third light-collection mirror 20.

The third light-collection mirror 20 includes a parabolic mirror. The third light-collection mirror 20 is arranged such that the focal point thereof and the second focal point of the second light-collection mirror 18 are substantially matched.

In addition, the illumination optical system IL has an optical integrator 25. In the present embodiment, the optical integrator 25 includes a reflective fly eye mirror optical system. The reflective fly eye mirror optical system 25 includes an incident side fly eye mirror 21 and an emission side fly-eye mirror 22. The third light-collection mirror 20 supplies the exposure light EL to the incident side fly eye mirror 21 of the reflective fly eye mirror optical system 25, with the exposure light EL substantially collimated.

The incident side fly eye mirror 21 includes a plurality of unit mirrors (reflecting element group) having reflecting surfaces disposed in parallel with each other, the reflecting surfaces having an arcuate shape substantially similar to an illumination field as disclosed, in for example, U.S. Pat. No. 6,452,661, and the like. The incident side fly eye mirror 21 is arranged at a position optically conjugate with the reflecting surface of the mask M and the surface of the substrate P, or in the vicinity thereof.

In addition, the emission side fly eye mirror 22 includes a plurality of unit mirrors (reflecting element group) corresponding to the plurality of unit mirrors of the incident side fly eye mirror 21. Each of the unit mirrors of the emission side fly eye mirror 22 has a rectangular shape and is arranged in parallel. The emission side fly eye mirror 22 is arranged at a position optically conjugate with the pupil position of the projection optical system PL, or in the vicinity thereof.

The collimated light from the third light-collection mirror 20 is incident on the incident side fly eye mirror 21 and undergoes wave front splitting through the incident side fly eye mirror 21.

Each of the unit mirrors of the incident side fly eye mirror 21 collects the incident light and forms a plurality of light collection points (light source image). A plurality of unit mirrors of the emission side fly eye mirror 22 are arranged at positions near where the plurality of light collection points are formed. A plurality of light collection points (secondary light source) which correspond to the number of unit mirrors of the emission side fly eye mirror 22 are formed on the emission surface of the emission side fly eye mirror 22 or in the vicinity thereof.

In addition, the illumination optical system IL has a condenser mirror 23. The condenser mirror 23 is arranged such that a focal position of the condenser mirror 23 and the position in the vicinity of the secondary light source which is formed by the reflective fly eye mirror optical system 25 are substantially matched. The light from the secondary light source formed by the reflective fly eye mirror optical system 25 is reflected and collected by the condenser mirror 23 and supplied to the mask M via an optical path bending mirror 24.

In this manner, the illumination optical system IL including the plurality of optical elements 20 to 24 uniformly illuminates an illumination region on the mask M with the exposure light EL emitted from the light source apparatus 13. The exposure light EL illuminated by the illumination optical system IL and reflected by the mask M is incident on the projection optical system PL.

Note that, in order to spatially separate the optical path of the light supplied to the mask M and the optical path of the light reflected by the mask M to be incident on the projection optical system PL, the illumination optical system IL of the present embodiment is a non-telecentric system. In addition, the projection optical system PL is also a mask side non-telecentric system.

The mask stage 11 is a stage capable of moving with six degrees of freedom in six directions, which are the X axis, Y axis, Z axis, θX, θY, and θZ directions, while holding the mask M. In the present embodiment, the mask stage 11 holds the mask M such that the reflecting surface of the mask M and the XY plane are substantially parallel.

The position information of the mask stage 11 (mask M) is measured by a laser interferometer 41. The laser interferometer 41 measures position information relating to the X axis, Y axis, and θZ directions of the mask stage 11 using a measuring mirror provided in the mask stage 11.

In addition, the surface position information of the surface of the mask M held by the mask stage 11 (position information relating to the Z axis, the θX, and the θY) is detected by a focus leveling detection system (not shown). The position of the mask M held by the mask stage 11 is controlled based on the measurement result made by the laser interferometer 41 and the detection result made by the focus leveling detection system.

In addition, the exposure apparatus EX of the present embodiment is provided with a blind member 60 arranged at a position opposite to at least a portion of the reflecting surface of the mask M and limits the illumination region of the exposure light EL on the reflecting surface of the mask M as disclosed in, for example, Japanese Unexamined Patent Application Publication No. 2004-356415A, and the like. The blind member 60 has an opening through which the exposure light EL can pass and defines the illumination region of the exposure light EL on the reflecting surface of the mask M.

The projection optical system PL includes a plurality of optical elements 31, 32, 33, 34, 35, 36 to which the exposure light EL from the mask M is supplied and projects an image of the pattern of the mask M illuminated by the exposure light EL onto the substrate P. At least one of the optical elements 31, 32, 33, 34, 35, 36 of the projection optical system PL may be the multilayer-film reflective mirror 10 described above.

The projection optical system PL is provided with a first mirror pair including a first reflecting mirror 31 having a reflecting surface with a concave surface and a second reflecting mirror 32 having a reflecting surface with a concave surface, a second mirror pair including a third reflecting mirror 33 having a reflecting surface with a predetermined shape and a fourth reflecting mirror 34 having a reflecting surface with a concave surface, and a third mirror pair including a fifth reflecting mirror 35 having a reflecting surface with a convex surface and a sixth reflecting mirror 36 having a reflecting surface with a concave surface.

In each of the mirror pairs, the first reflecting mirror 31, the third reflecting mirror 33, and the fifth reflecting mirror 35 are each arranged such that the reflecting surfaces face the object plane side (mask M side) of the projection optical system PL, and the second reflecting mirror 32, the fourth reflecting mirror 34, and the sixth reflecting mirror 36 are each arranged such that the reflecting surfaces face the image plane side (substrate P side) of the projection optical system PL.

The exposure light EL from the mask M forms an intermediate image after being reflected by the first mirror pair in order of the first reflecting mirror 31 and the second reflecting mirror 32. The light from the intermediate image is reflected by the second mirror pair in order of the third reflecting mirror 33 and the fourth reflecting mirror 34. The light reflected by the second mirror pair is reflected by the third mirror pair in order of the fifth reflecting mirror 35 and the sixth reflecting mirror 36 to be guided to the substrate P. A field stop FS which limits the projection region on the substrate P is arranged at a position where the intermediate image is formed.

An aperture stop AS which limits the numerical aperture NA of the projection optical system PL is arranged between the first reflecting mirror 31 and the second reflecting mirror 32 of the first mirror pair. The aperture stop AS has an opening with a variable size (diameter). The size (diameter) of the opening is controlled by an aperture stop control unit 51.

The substrate stage 12 is a stage capable of moving with six degrees of freedom in six directions, which are the X axis, Y axis, Z axis, θX, θY, and θZ directions, while holding the substrate P. In the present embodiment, the substrate stage 12 holds the substrate P such that the surface of the substrate P and the XY plane are substantially parallel.

Position information of the substrate stage 12 (substrate P) is measured by a laser interferometer 42. The laser interferometer 42 measures position information relating to the X axis, Y axis, and θZ directions of the substrate stage 12 using a measuring mirror provided in the substrate stage 12. In addition, the surface position information of the surface of the substrate P held by the substrate stage 12 (position information relating to the Z axis, the θX, and the θY) is detected by the focus leveling detection system (not shown).

The position of the substrate P held by the substrate stage 12 is controlled based on the measurement result made by the laser interferometer 42 and the detection result made by the focus leveling detection system.

When exposing the substrate P, the substrate stage 12 holding the substrate P is moved in the Y axis direction in synchronization with the movement of the mask stage 11 holding the mask M in the Y axis direction while the illumination optical system IL illuminates a predetermined illumination region on the mask M with the exposure light EL. As a result, the image of the pattern of the mask M is projected onto the substrate P via the projection optical system PL.

As described above, according to the present embodiment, since the thickness of each position (each portion) of the multilayer film 4 is made to be different such that the light EL is reflected based on the incident angle of the light EL with respect to the surface 4S of the multilayer film 4 without the distribution of the thickness of the multilayer film 4 having an axis of rotational symmetry, it is possible for the multilayer film 4 to reflect the incident light EL with high reflectance. Accordingly, it is possible to suppress the generation of exposure defects caused by a decrease in the reflectance in the multilayer film and the generation of defective devices.

For example, in a case where portions of a plurality of multilayer films 4 in a circle with the optical axis of the multilayer-film reflective mirror as the center are set to the same thickness, as described with reference to FIG. 3 and FIG. 4, there is a possibility that there will be a portion which is not capable of reflecting the light EL depending on the incident angle of the light EL. In addition, when trying to increase the incident angle range of the light EL in which the light EL can be reflected, for example, there is a possibility that the maximum reflectance will decrease as described with reference to the line Ca2 in FIG. 3.

In the present embodiment, for example, the necessary thickness of the multilayer film 4 in each of the first portion PA1 and the second portion PA2 is calculated so as to obtain a target reflectance in each of the first portion PA1 and the second portion PA2. The calculated result is fitted to a function, and then the multilayer film 4 is manufactured. As a result, it is possible to manufacture the multilayer-film reflective mirror 10 having the multilayer film 4 with the desired reflectance. That is, it is possible to manufacture a reflective mirror with high reflectance.

In addition, by using the multilayer-film reflective mirror 10 according to the present embodiment in at least one of the illumination optical system IL and the projection optical system PL, it is possible to suppress a decrease in the optical performance of these optical systems IL and PL and in the exposure performance of the exposure apparatus EX. Accordingly, throughput of the exposure apparatus is improved.

Note that description was given of an example of a case where the multilayer film 4 is an Mo/Si multilayer film in each of the embodiments described above; however, for example, it is possible to change the material forming the multilayer film 4 according to the wavelength band of the EUV light. For example, in a case of using EUV light of a wavelength band close to 11.3 nm, it is possible to obtain a high reflectance by using an Mo/Be multilayer film where a molybdenum layer (Mo layer) and a beryllium layer (Be layer) are laminated alternately.

In addition, in each of the embodiments described above, ruthenium (Ru), molybdenum carbide ($Mo_2C$), molybdenum oxide ($MoO_2$), molybdenum silicide ($MoSi_2$), and the like may be used as the material for forming the first layer 1 of the multilayer film 4. In addition, it is possible to use silicon carbide (SiC) as the material forming the second layer 2 of the multilayer film 4.

Alternatively, it is possible for the multilayer-film reflective mirror 10 to use a reflective mirror having a reflecting surface which is an aspherical surface or a free-form surface. In such a case, for example, it is possible to regard a straight line passing through the origin obtained from a formula representing the aspherical surface or free-form surface, or a straight line passing through the center or the center of gravity of the reflecting surface (a reference line or a reference axis) as the "optical axis".

In one embodiment, it is possible to determine the optical axis in the reflective mirror having a spherical reflecting surface or another reflecting surface as a design reference. Alternatively and/or additionally, it is possible to regard a straight line passing through the origin obtained from a formula representing a curved surface of the reflecting surface (a reference line or a reference axis), or a straight line passing through the center or the center of gravity of the reflecting surface (a reference line or a reference axis) as the optical axis, and it is possible to determine the optical axis as a design reference.

In addition to a semiconductor wafer for manufacturing a semiconductor device, a glass substrate for a display device, a ceramic wafer for a thin-film magnetic head, an original plate (synthetic quartz or silicon wafer) of a mask or a reticle used in the exposure apparatus, or the like may be applied as the substrate P in the embodiment described above.

As for the exposure apparatus EX, in addition to a scan type exposure apparatus of step-and-scan type (scanning stepper) in which while synchronously moving the mask M and the substrate P, the pattern of the mask M is scan-exposed, a step-and-repeat type projection exposure apparatus (stepper) in which the pattern of the mask M is exposed in a batch in the condition that the mask M and the substrate P are stationary, and the substrate P is successively moved stepwise can be used.

Furthermore, in the step-and-repeat type exposure, after a reduced image of a first pattern is transferred onto the substrate P by using the projection optical system, in the state with the first pattern and the substrate P being substantially stationary, a reduced image of a second pattern may be exposed in a batch onto the substrate P, the reduced image of the second pattern being partially overlapped on the first pattern, by using the projection optical system, in a state with the second pattern and the substrate P being substantially stationary (a stitch type batch exposure apparatus).

In addition, it is also possible to apply the stitch type exposure apparatus to a step-and-stitch type exposure apparatus transferring at least two patterns onto the substrate P in a partially overlapping manner, and moving the substrate P in sequence.

In addition, for example, it is also possible to apply the present invention to an exposure apparatus which combines patterns of two masks on a substrate via a projection optical system, and double exposes a single shot region on the substrate at substantially the same time, using a single scan exposure light, as disclosed in U.S. Pat. No. 6,611,316, or the like.

In addition, it is also possible to apply the present invention to a twin stage type exposure apparatus provided with a plurality of substrate stages as disclosed in U.S. Pat. No. 6,341,007, U.S. Pat. No. 6,400,441, U.S. Pat. No. 6,549,269, U.S. Pat. No. 6,590,634, U.S. Pat. No. 6,208,407, U.S. Pat. No. 6,262,796, and the like.

Furthermore, for example, it is also possible to apply the present invention to an exposure apparatus provided with a substrate stage holding a substrate and a measurement stage on which is mounted a reference member where a reference mark is formed and/or various photoelectric sensors, as disclosed in U.S. Pat. No. 6,897,963 and the like. In addition, it is possible to apply the present invention to an exposure apparatus provided with a plurality of substrate stages and measurement stages.

The types of the exposure apparatuses EX are not limited to exposure apparatuses for manufacturing semiconductor elements which expose semiconductor element patterns onto a substrate P, and are widely applicable to apparatuses including exposure apparatuses for manufacturing liquid crystal display elements or for manufacturing displays, and exposure apparatuses for manufacturing thin-film magnetic heads, picture elements (CCD), micromachines, MEMS, DNA chips, reticles, masks, and the like.

The exposure apparatus EX of the present embodiment is manufactured by assembling various subsystems including each of the constituent elements listed in the Claims so as to maintain a predetermined mechanical precision, electrical precision, and optical precision. In order to ensure these precisions, adjustments to achieve the optical precision for the various optical systems, adjustments to achieve the mechanical precision for the various mechanical systems, and adjustments to achieve the electrical precision for the various electrical systems are performed before and after this assembly.

The process of assembling the various subsystems into the exposure apparatus includes mechanical connections, wiring connections of electrical circuits, piping connections of air pressure circuits, and the like between the various subsystems. Before the process of assembling the various subsystems into the exposure apparatus, it is needless to mention that there are individual assembly processes for each of the subsystems. When the assembly processes of the various subsystems into the exposure apparatus are finished, comprehensive adjustment is performed and the various precisions are ensured for the exposure apparatus as a whole.

Note that, it is desirable that the manufacturing of the exposure apparatus be performed in a clean room where the temperature, the cleanliness, and the like are controlled.

Figure 11:
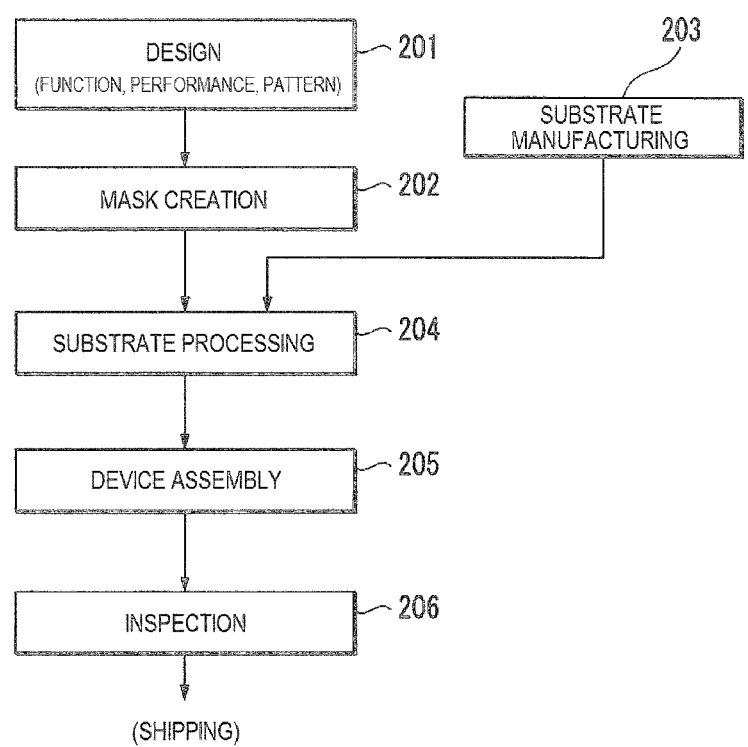
FIG. 11 is a flow chart for explaining an example of a device manufacturing method according to the present embodiment.

As shown in FIG. 11, devices such as semiconductor devices are manufactured through: a step 201 of performing function and performance design for the device, a step 202 of creating the mask (reticle) based on this design step, a step 203 of manufacturing the substrate which is a base of the device, a substrate processing step 204 including substrate processing (exposure processing) for exposing the substrate P to exposure light from the pattern of the mask according to the embodiment described above and for developing the exposed substrate, a device assembly step (including treatment process such as a dicing process, a bonding process, and a packaging process) 205, an inspection step 206, and the like. By implementing the aspects of the present invention, the throughput of the device manufacturing is improved.

Note that, it is possible to combine the conditions of each of the embodiments described above as appropriate. In addition, there may be cases where some constituent elements are not used. In addition, the disclosures of all of the published patents and US Patents relating to apparatuses or the like cited in each of the embodiments and modifications described above are incorporated as a part hereof by reference to the extent permitted by law.

BRIEF DESCRIPTION OF THE REFERENCE SYMBOLS

1 FIRST LAYER
2 SECOND LAYER
4 MULTILAYER FILM
4S SURFACE
5 BASE
5S SURFACE
10 MULTILAYER-FILM REFLECTIVE MIRROR (REFLECTIVE MIRROR)
EX EXPOSURE APPARATUS

The invention claimed is:

1. A reflective mirror for reflecting incident light comprising:
a base having a base surface that includes a first surface portion and a second surface portion associated with a first base height and a second base height, respectively; and
a multilayer film having a first surface situated on the base surface and a second surface opposite the first surface, wherein the second surface has a constant height, wherein the multilayer film is configured to reflect at least a portion of the incident light and includes a first layer and a second layer that are laminated alternately on the base, the multilayer film including a first portion having a first thickness situated at the first surface portion of the base that is associated with the first base height and a second portion having a second thickness different from the first thickness situated at the second surface portion of the base that is associated with the second base height, the second portion being provided at a position rotationally symmetric to a position of the first portion about an optical axis of the reflective mirror.

2. The reflective mirror according to claim 1, wherein, in the multilayer film, the first thickness and the second thickness are each determined such that light incident at a first angle on the first portion is reflected, light incident at a second angle on the second portion is reflected, and a difference in reflectance of the incident light between the first portion and the second portion is reduced.

3. The reflective mirror according to claim 1, wherein the multilayer film has a thickness distribution, the thickness distribution changing in an azimuthal direction of the optical axis of the reflective mirror.

4. The reflective mirror according to claim 1, wherein the multilayer film has a thickness distribution, the thickness distribution not being rotationally symmetric about the optical axis of the reflective mirror.

5. The reflective mirror according to claim 1, wherein the multilayer film is line symmetric with respect to a line passing through a center of a region to which the light is incident on a surface of the multilayer film and the optical axis of the reflective mirror.

6. The reflective mirror according to claim 1, wherein the multilayer film has a thickness distribution, the thickness distribution having a finite order of rotational symmetry on the surface of the multilayer film.

7. The reflective mirror according to claim 1, wherein the base has a first surface where the first portion is formed and a second surface where the second portion is formed, the second surface being provided to be separated with respect to the first surface in a direction of lamination of the multilayer film.

8. A projection optical system comprising a plurality of optical elements, the projection optical system projecting an image of a first surface onto a second surface, and at least one of the optical elements being the reflective mirror recited in claim 1.

9. The projection optical system according to claim 8, wherein light from the first surface is irradiated onto the second surface via the plurality of optical elements, and at least an optical element where an incident angle range of the light is largest out of the plurality of optical elements is the reflective mirror.

10. An exposure apparatus for exposing a substrate to exposure light comprising the reflective mirror recited in claim 1.

11. A device manufacturing method comprising steps of:
exposing a substrate using the exposure apparatus recited in claim 10; and
developing the exposed substrate.

12. A reflective mirror for reflecting incident light, comprising:
a base; and
a multilayer film configured to reflect at least a portion of the incident light and including a first layer and a second layer that are laminated alternately on the base, the multilayer film including a first portion having a first thickness and a second portion having a second thickness different from the first thickness, the second portion being provided at a position rotationally symmetric to a position of the first portion about an optical axis of the reflective mirror, wherein a shape of a surface of the base at which the multilayer film is situated is determined such that an aberration associated with a thickness distribution of the multilayer film is reduced.

13. The reflective mirror according to claim 12, wherein the base has a first surface where the first portion is formed and a second surface where the second portion is formed, the second surface being provided to be separated with respect to the first surface in a direction of lamination of the multilayer film.

14. A projection optical system, comprising a plurality of optical elements, the projection optical system projecting an image of a first surface onto a second surface, and at least one of the optical elements being the reflective mirror recited in claim 12.

15. An exposure apparatus for exposing a substrate to exposure light, comprising the reflective mirror recited in claim 12.

16. A method comprising:
defining a mirror base having at least a first surface portion and second surface portion having different surface heights;
providing a multilayer film configured to reflect at least a portion of light incident to the multilayer film, the multilayer film including a first layer and a second layer that are laminated alternately on the mirror base, the multilayer film including a first portion having a first thickness situated at the first surface portion of the mirror base and a second portion situated at the second surface portion of the mirror base, wherein the different surface heights are selected based on an optical aberration associated with a thickness distribution of the multilayer film.

17. The method of claim 16, wherein the multilayer film includes a first surface situated at the mirror base and an opposing surface, wherein the opposing surface has a constant height.

18. The method of claim 17, wherein the multilayer film includes a first portion situated at the first surface portion of the base and a second portion situated at the second surface portion of the base, wherein at least some layers of the first portion of the multilayer film and the second portion of the multilayer film have different layer periods.

19. A reflective mirror, comprising:
a mirror base having a mirror base surface that includes a first surface portion and a second surface portion associated with a first mirror base height and a second mirror base height, respectively; and
a multilayer film having a first surface situated on the mirror base surface and a second surface opposite the first surface, wherein the multilayer film is configured to reflect at least a portion of the incident light and includes a first layer and a second layer that are laminated alternately on the base, the multilayer film including a first portion having a first thickness situated at the first surface portion of the mirror base that is associated with the first mirror base height and a second portion having a second thickness different from the first thickness situated at the second surface portion of the mirror base that is associated with the second mirror base height,
wherein the second portion of the multilayer film is situated at a position rotationally symmetric to a position of the first portion of the multilayer film about an optical axis of the reflective mirror.

20. A reflective mirror, comprising:
a mirror base having a mirror base surface that includes a first surface portion and a second surface portion associated with a first mirror base height and a second mirror base height, respectively; and
a multilayer film having a first surface situated on the mirror base surface and a second surface opposite the first surface, wherein the multilayer film is configured to reflect at least a portion of the incident light and includes a first layer and a second layer that are laminated alternately on the base, the multilayer film including a first portion having a first thickness situated at the first surface portion of the mirror base that is associated with the first mirror base height and a second portion having a second thickness different from the first thickness situated at the second surface portion of the mirror base that is associated with the second mirror base height,
wherein a height of the first surface portion of the multilayer film is based on the height of the first mirror base portion and the thickness of the first surface portion of the multilayer film, and a height of the second surface portion of the multilayer film is based on the height of the second mirror base portion and the thickness of the second surface portion of the multilayer film, and wherein the height of the first surface portion of the multilayer film corresponds to the height of the second surface portion of the multilayer film.

21. A reflective mirror, comprising:
a mirror base having a mirror base surface that includes a first surface portion and a second surface portion associated with a first mirror base height and a second mirror base height, respectively; and
a multilayer film having a first surface situated on the mirror base surface and a second surface opposite the first surface, wherein the multilayer film is configured to reflect at least a portion of the incident light and includes a first layer and a second layer that are laminated alternately on the base, the multilayer film including a first portion having a first thickness situated at the first surface portion of the mirror base that is associated with the first mirror base height and a second portion having a second thickness different from the first thickness situated at the second surface portion of the mirror base that is associated with the second mirror base height,
wherein the multilayer film has a thickness distribution that varies so as to compensate a height difference between the first surface portion of the mirror base and the second surface portion of the mirror base.

22. A projection optical system comprising a plurality of optical elements, the projection optical system projecting an image of a first surface onto a second surface, and at least one of the optical elements being the reflective mirror recited in claim 19.

23. An exposure apparatus for exposing a substrate to exposure light comprising the reflective mirror recited in claim 19.

24. A device manufacturing method comprising steps of:
exposing a substrate using the exposure apparatus recited in claim 23; and
developing the exposed substrate.

25. A projection optical system comprising a plurality of optical elements, the projection optical system projecting an image of a first surface onto a second surface, and at least one of the optical elements being the reflective mirror recited in claim 20.

26. An exposure apparatus for exposing a substrate to exposure light comprising the reflective mirror recited in claim 20.

27. A device manufacturing method comprising steps of:
exposing a substrate using the exposure apparatus recited in claim 26; and
developing the exposed substrate.

28. A projection optical system comprising a plurality of optical elements, the projection optical system projecting an image of a first surface onto a second surface, and at least one of the optical elements being the reflective mirror recited in claim 21.

29. An exposure apparatus for exposing a substrate to exposure light comprising the reflective mirror recited in claim 21.

30. A device manufacturing method comprising steps of:
exposing a substrate using the exposure apparatus recited in claim 29; and
developing the exposed substrate.

* * * * *